United States Patent
Fang et al.

(10) Patent No.: US 10,450,655 B2
(45) Date of Patent: Oct. 22, 2019

(54) CVD APPARATUS WITH MULTI-ZONE THICKNESS CONTROL

(71) Applicant: Taiwan Semiconductor Manufacturing Co., Ltd., Hsin-Chu (TW)

(72) Inventors: Chung-Wei Fang, Hsinchu (TW); Yi Hsun Chiu, Zhubei (TW); Cho-Han Li, New Taipei (TW); Yao Fong Dai, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 15/795,730

(22) Filed: Oct. 27, 2017

(65) Prior Publication Data

US 2019/0127852 A1    May 2, 2019

(51) Int. Cl.
| | |
|---|---|
| *C23C 16/52* | (2006.01) |
| *H01L 21/02* | (2006.01) |
| *C23C 16/44* | (2006.01) |
| *C23C 16/455* | (2006.01) |
| *C23C 16/56* | (2006.01) |
| *H01L 21/3105* | (2006.01) |
| *H01L 21/66* | (2006.01) |

(52) U.S. Cl.
CPC .......... *C23C 16/52* (2013.01); *C23C 16/4412* (2013.01); *C23C 16/45565* (2013.01); *C23C 16/56* (2013.01); *H01L 21/02126* (2013.01); *H01L 21/02274* (2013.01); *H01L 21/31053* (2013.01); *H01L 22/12* (2013.01)

(58) Field of Classification Search
CPC .............. C23C 16/52; C23C 16/45565; C23C 16/4412; C23C 16/56; H01L 21/02274; H01L 22/12; H01L 21/02126; H01L 21/31053

See application file for complete search history.

(56) References Cited

U.S. PATENT DOCUMENTS

| | | | |
|---|---|---|---|
| 2002/0193902 A1* | 12/2002 | Shanmugasundram | B24B 49/18 700/121 |
| 2012/0108066 A1* | 5/2012 | New | C23C 16/402 438/692 |
| 2016/0010208 A1 | 1/2016 | Huang et al. | |

* cited by examiner

*Primary Examiner* — Sonya D. McCall-Shepard
(74) *Attorney, Agent, or Firm* — Eschweiler & Potashnik, LLC

(57) ABSTRACT

The present disclosure relates to a chemical vapor deposition apparatus and associated methods. In some embodiments, the CVD apparatus has a vacuum chamber and a gas import having a gas import axis through which a process gas is imported into the vacuum chamber and being arranged near an upper region of the vacuum chamber. At least one exhaust port is arranged near a bottom region of the vacuum chamber. The CVD apparatus also has a shower head arranged under the gas import having a plurality of holes formed there through with at least two different diameters or densities. The shower head redistributes the process gas to form a precursor material with an uneven thickness that matches a remove profile of a subsequent CMP process. As a result, planarity of the formed layer after the CMP process is improved.

20 Claims, 4 Drawing Sheets

CVD APPARATUS WITH MULTI-ZONE THICKNESS CONTROL

BACKGROUND

In the fabrication of integrated circuits (ICs), chemical vapor deposition (CVD) is one of the important processes to form thin layers or films on a substrate. In the CVD process, the substrate is exposed to a precursor gas which reacts at the surface of the substrate and deposits a product of the reaction thereon.

A current trend of the CVD apparatus design is towards processing single wafer of large size, which can be integrated with other manufacturing process steps. As substrate size increases, approaches such as gas distribution systems, substrate heating and cooling systems and chamber constructions, design and symmetry among other approaches are studied to form a uniform film, in other words, a film with less variation of thickness, on the substrate.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
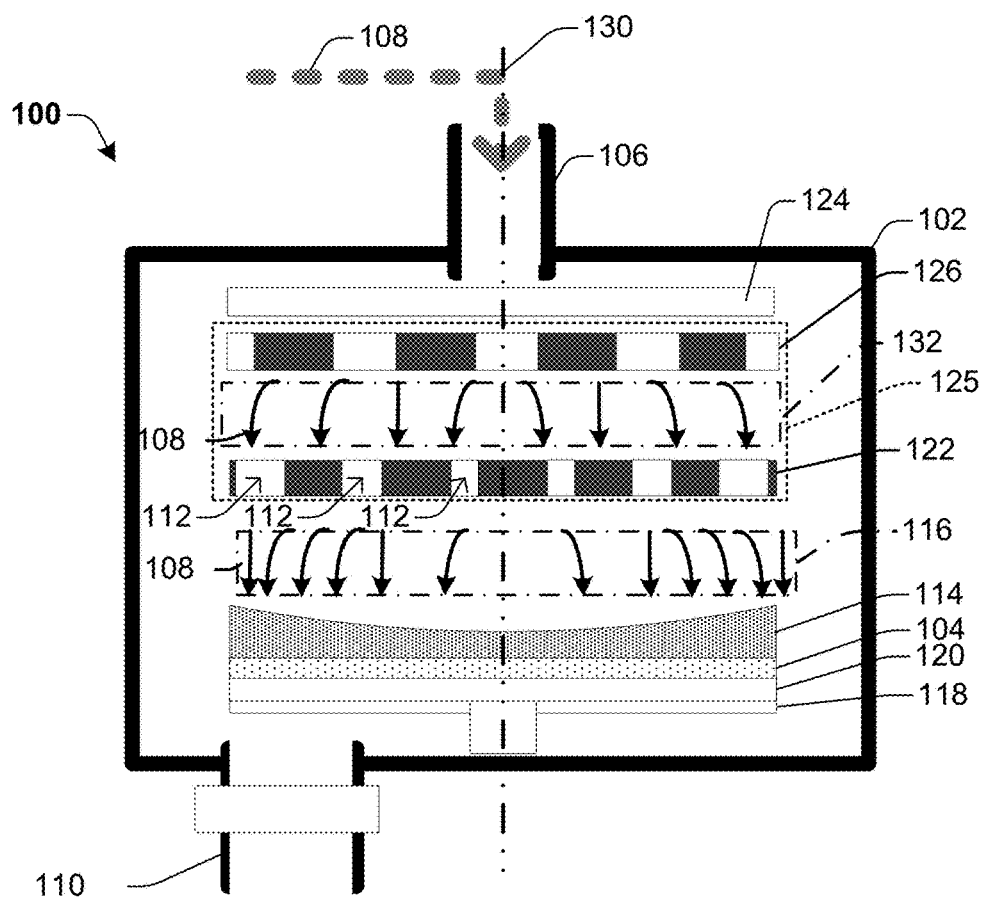
FIG. 1 shows a perspective view of a CVD apparatus in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Due to the fast shrinkage of the feature size and the increased number of devices, more metal interconnect layers were required for each new generation of ICs, especially for logic chips and microprocessors. The quick build-up of surface topography with the increase of interconnect layers usually results in a poor step coverage of the metal deposition. It thus requires a global planarization technique on the inter-layer dielectric (ILD) surface. One approach to produce a flat and smooth surface for a wafer with more complex chip design is to perform a uniform and planar deposition followed by a polishing process. The deposition is controlled by keeping average deposition thickness and thickness variance within certain ranges. After depositing a precursor material, chemical-mechanical polishing (CMP) is one of the commonly used polishing solutions. Ideally, a wafer should be polished homogeneously and uniformly across the entire wafer. The removal rate should be identical on every measurement spot within a wafer. Unfortunately, in reality, a local thickness variation exists within the wafer after the CMP process, due to CMP pad deformation profile, pressure distributions, among other factors. This thickness variation includes, but not limited to an edge effect, where a thickness variation occurs at the very edge of the wafer. Therefore, even the average deposition thickness and thickness variance are controlled prior to the polishing process, the polishing profile would generate unpredictable post-polishing thickness profiles. For example, if the applied polishing process has a greater remove rate at the edge of wafer (i.e., the polishing process would generate a convex surface profile on an assumed planar surface), a first wafer with a concave deposition surface profile would be at least partially "offset" while a second wafer with a convex surface deposition surface profile would have a worse surface variation after the polishing process. Thus, the resulted wafer condition is hard to control, which may increase the out of control rate and rework rate of the volume production.

The present disclosure is related to a CVD apparatus to form a planar dielectric or metal layer over a substrate, and an associated fabrication method. In some embodiments, a CMP remove profile of a CMP process is determined. A precursor material is then deposited over a substrate according to the determined CMP remove profile, such that the deposited precursor material has a thickness profile that matches the CMP remove profile. Then, the CMP process is performed to the precursor material to form a dielectric or metal layer with a planar surface. For example, a CMP remove profile of the CMP process may be determined that a remove rate of the CMP process decreases from an edge region of the wafer to a center region linearly. Then the precursor material is deposited over the substrate with a deposition rate substantially equal to or at least matching the trend of the remove rate of the CMP process. The CMP process is performed after the deposition of the precursor material. Since the deposition rate of the dielectric or metal material matches the subsequent remove rate, the planarity of the formed dielectric or metal layer is improved. In some embodiments, the deposition rate of the precursor material is controlled by adjusting hole arrangement of a shower head of the deposition chamber. In the above example, the shower head may have hole densities or dimensions decreasing from an edge region of the deposition chamber to a center region of the deposition chamber.

FIG. 1 shows a perspective view of a CVD apparatus 100 in accordance with some embodiments. The CVD apparatus 100 comprises a vacuum chamber 102. A gas import 106 is arranged at one side of the vacuum chamber 102, for example, near an upper region of the vacuum chamber 102 with a gas import axis 130. At least one exhaust port 110 is arranged at the opposite side of the vacuum chamber, for example, near a bottom region of the vacuum chamber 102. A process gas 108 is imported into the vacuum chamber 102 from the gas import 106 and passes in a laminar or substantially laminar fashion to the exhaust port 110. A wafer chuck 120 is arranged between the gas import 106 and the exhaust port 110 at a lower section of the vacuum chamber 102. The wafer chuck 120 holds a semiconductor substrate 104, such as a 200 mm, 300 mm, or 450 mm silicon wafer, for example.

A gas distribution system 125 is arranged between the gas import 106 and the wafer chuck 120 and close to the gas import 106 to distribute the process gas 108. In some embodiments, the gas distribution system 125 comprises a block plate 126 with a plurality of apertures formed there through. The block plate 126 provides guidance when the process gas 108 is applied. In some embodiments, the plurality of apertures of the block plate 126 may be evenly arranged with substantially same diameters. In some alternative embodiments, the plurality of apertures may be less arranged or have smaller dimensions in a central region than an edge region of the block plate 126. The uneven arrangement of the plurality of apertures provides offset for the distribution of the process gas 108, e.g. to correct uneven accumulation of the process gas 108 at the center region of the vacuum chamber 102 when the gas import 106 is arranged at the center region of the vacuum chamber 102. Thus, the redirected gas 132 uniformly reaches central and edge regions of a lower region of the vacuum chamber 102.

In some embodiments, the gas distribution system 125 comprises a showerhead 122 disposed under the block plate 126 with a lateral dimension approximately equal to that of the wafer chuck 120. In some embodiments, the showerhead 122 has a plurality of holes 112 formed there through with at least two different diameters or densities. The uneven arrangement of the plurality of holes 112 provides a guide to the process gas 108 to generate an uneven redirected gas 116 downstream the showerhead 122. The hole arrangement of the showerhead 122 and the corresponding uneven redirected gas 116 are determined according to surface profile alteration characteristics of one or more subsequent fabrication steps, such that a resulted collective surface profile is planar or under control. In some embodiments, the hole arrangement of the showerhead 122 and the corresponding uneven redirected gas 116 are determined according to a CMP process following a CVD process performed in the CVD apparatus 100. More specifically, the hole arrangement of the showerhead 122 is determined according to a CMP process performed after the CVD process such that a precursor material 114 with an uneven top surface is formed by the CVD process and is configured to offset an uneven factor of the CMP process.

The precursor material 114 can be a dielectric or metal material. For example, the precursor material 114 can be copper or copper alloy used for interconnection metal lines or metal vias. The precursor material 114 can also be silicon dioxide and silicon nitride materials used in the fabrication of electronic devices to isolate multiple conductive layers, capacitors, and for surface passivation. These films may also be used for encapsulation to protect devices from corrosion by atmospheric elements such as moisture and oxygen.

In some embodiments, the CVD apparatus 100 can be a plasma-enhanced chemical vapor deposition (PECVD), atmospheric pressure CVD, or metal organic CVD apparatus. The upper region of the vacuum chamber 102 is a dome or a flange. The wafer chuck 120 has a diameter that is substantially same as that of the showerhead 122 and is moveable vertically along the axis 130. The moveable wafer chuck 120 is used to adjust its location in the vacuum chamber 102. A heating system or cooling system can be included in the wafer chuck 120 to heat or cool the semiconductor substrate 104 and/or arranged to heat or cool walls of the vacuum chamber 102. The PECVD is a process by which thin films of various materials can be deposited on the semiconductor substrate 104 at a lower temperature than that of a standard chemical vapor deposition (CVD). A DC power source or an RF power source can be attached to the vacuum chamber 102 to create plasma in plasma enhanced CVD process. In PECVD processes, deposition is achieved by introducing reactant gases between parallel electrodes—a RF-energized or DC electrode 124 and a grounded electrode 118. Or, the chamber may have coils to create higher density, inductively coupled plasma. In either case, the gas distribution system 125 plays an important role in the resulting film uniformity. The capacitive coupling between the electrodes 124 and 118 excites the reactant gases into a plasma, which induces a chemical reaction and results in the reaction product being deposited on the substrate. The semiconductor substrate 104, which is placed on the grounded electrode 118, may be heated to 250° C. to 350° C., depending on the specific film requirements. In comparison, a standard CVD without plasma excitation may need a higher temperature, for example, heated to a range between 600° C. and 800° C. The lower deposition temperatures are critical in many applications where CVD temperatures could damage the devices being fabricated. The films typically deposited using PECVD are silicon nitride (SixNy), silicon dioxide (SiO2), silicon oxynitride (SiOxNy), silicon carbide (SiC), and amorphous silicon (α-Si). Silane (SiH4), the silicon source gas, is combined with an oxygen source gas to form silicon dioxide or a nitrogen gas source to produce silicon nitride. In some embodiments, a tetraethylorthosilicate material is used to form an oxide layer by the PECVD process (PE-TEOS). With plasma excitation, high deposition rates are obtained from TEOS/oxygen.

Figure 2:
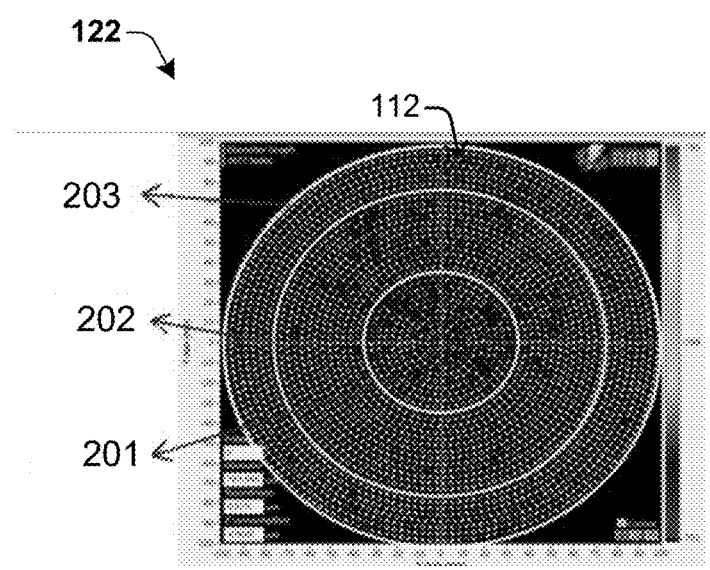
FIG. 2 shows a top view of a part of a CVD apparatus—a shower head hole structure in accordance with some embodiments.

FIG. 2 shows a top view of the shower head 122 of the CVD apparatus 100 of FIG. 1 in accordance with some embodiments. As an example, the shower head 122 may have a first control zone 201, a second control zone 202, and a third control zone 203 defined from a center region to a peripheral region of the shower head 122. Each of the control zones 201, 202, and 203 comprises a plurality of holes 112. The holes 112 of the second control zone 202 has an average diameter about 4% to about 8% greater than that of the first control zone 201, and the holes 112 of the third control zone 203 has an average diameter about 4% to about 8% greater than that of the second control zone 202. The first, second, and third control zones 201, 202, and 203 may have substantially same numbers of hole rings. For example, each of the control zones 201, 202, and 203 may comprise 10 hole rings. A density of the holes 112 in each ring of the first, second, and third control zones 201, 202, and 203 may be substantially same, i.e., a distance between two holes 112 of each ring along a perimeter of the hole ring may be same. As a more specific example, the holes 112 of the first control zone 201 has an average diameter in a range of from about 0.68 mm to about 0.72 mm. The holes 112 of the second control zone 202 has an average diameter in a range of from about 0.72 mm to about 0.76 mm. The holes 112 of the third control zone 203 has an average diameter in a range of from about 0.76 mm to about 0.80 mm. The error range of the diameters of the holes 112 of the control zones 201, 202, and 203 may be less than 20 µm. As discussed above in FIG. 1, FIG. 2 is just an example of the hole arrangement of the showerhead 122 for illustration purpose and is not for limiting purpose. It is understood by the person of ordinary skill in the art that the hole arrangement of the showerhead 122 can be designed in varies ways and can be altered in order to redirect the process gas to achieve the desired distribution.

Figure 3A:
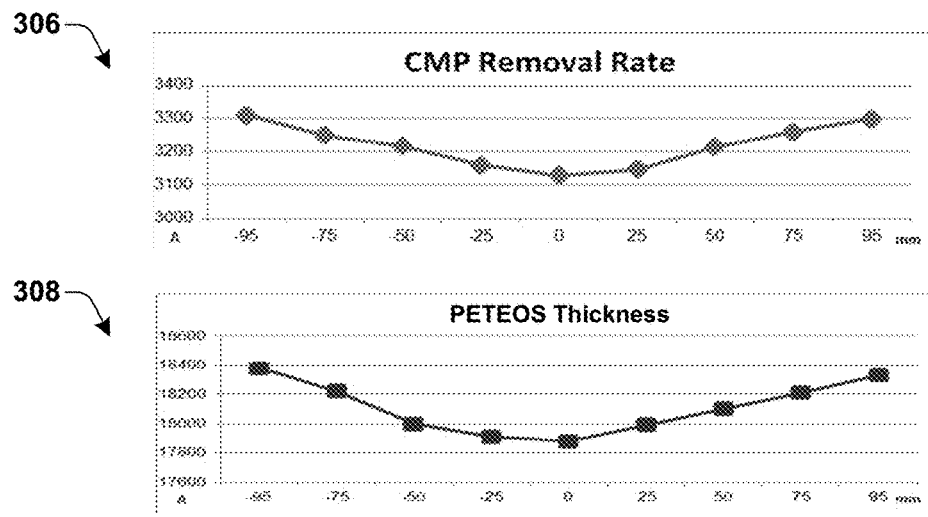
FIGS. 3A-3B show a method of chemical vapor deposition (CVD) having a deposition thickness profile matching a pre-determined chemical-mechanical polishing (CMP) remove profile in accordance with some embodiments.
Figure 3B:
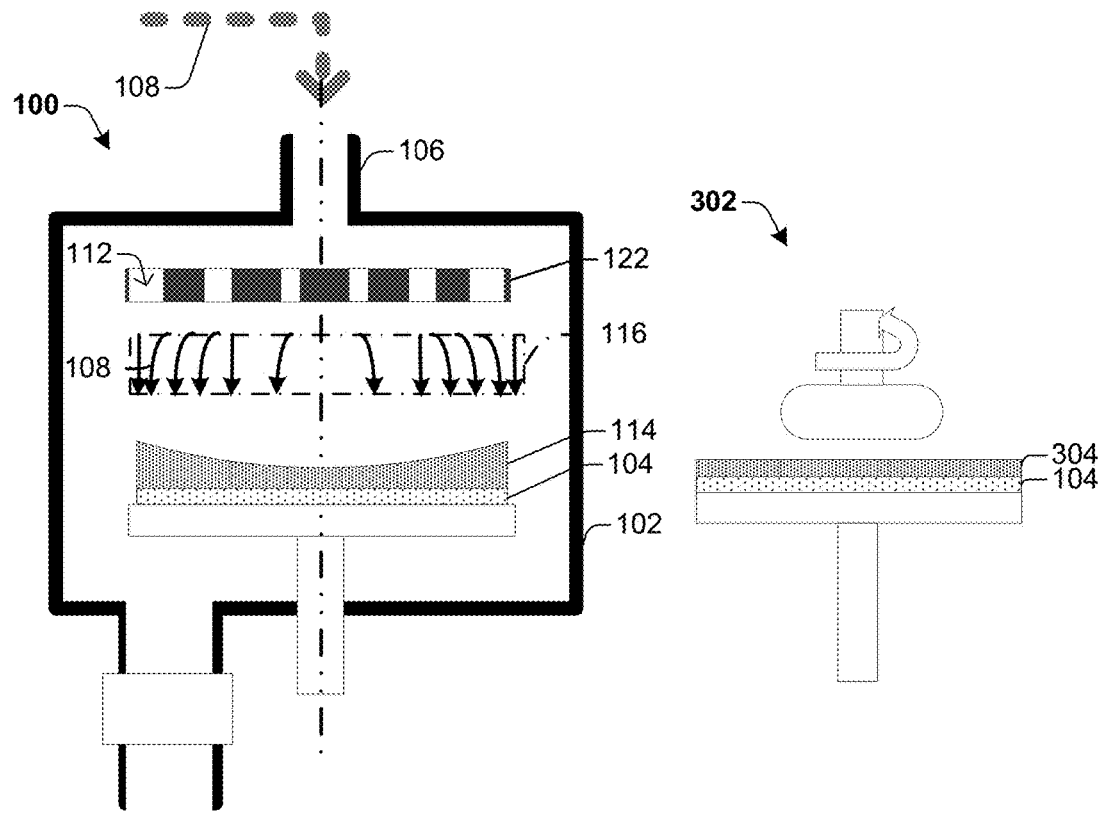

FIGS. 3A-3B shows a method of chemical vapor deposition (CVD) having a deposition thickness profile matching a pre-determined CMP remove profile in accordance with some embodiments. As shown in FIG. 3B, a deposition process is performed in the CVD apparatus 100 followed by a polishing process performed by a chemical-mechanical polishing tool 302. A CMP remove profile of the chemical-mechanical polishing tool 302 is determined before the deposition process. For large substrate sizes, for example, silicon wafers having diameters of 200 mm to 300 mm, or even 450 mm or more, it is difficult to perform the polishing process uniformly on the entire wafer. As a result, a removal rate of the polishing process may vary along a wafer surface. As shown in FIG. 3A, a CMP remove profile is determined first and shown as an example by diagram 306. In diagram 306, the polishing process polishes a wafer with a diameter of about 190 mm about 6.7% faster at an edge region than a center region and would result in a center thick surface profile if the polishing process is performed onto a planar surface. The CMP remove profile may be determined by a modeling process or a prototype test. Then, the deposition process in the CVD apparatus 100 is designed to form the precursor material 114 onto the semiconductor substrate 104. An example of the targeting CVD thickness profile is shown by diagram 308, which matches the CMP remove profile shown in diagram 306. As shown in diagram 308, a center region of the substrate has a precursor material with a thickness of approximately 17800 Å, while an edge region of the substrate has a thicker precursor material with a thickness of about 18400 Å. This is an example of a non-uniform deposition. As illustrated above, the CVD thickness profile can be controlled by arranging the shower head 122 under the gas import 106 of the vacuum chamber 102. In this example, the shower head 122 has holes 112 with a greater diameter at the edge region than the center region. The process gas 108 passes through the holes 112 and accumulates as the redirected gas 116 under the shower head 122. The redirected gas 116 is laterally unevenly distributed and has a greater density at the edge region than the center region. As a result, the deposited precursor material 114 is non-uniform and is edge thick in this example. Then, the CMP process is performed to the precursor material 114 to form a dielectric or metal layer 304 with a planar surface.

Figure 3C:
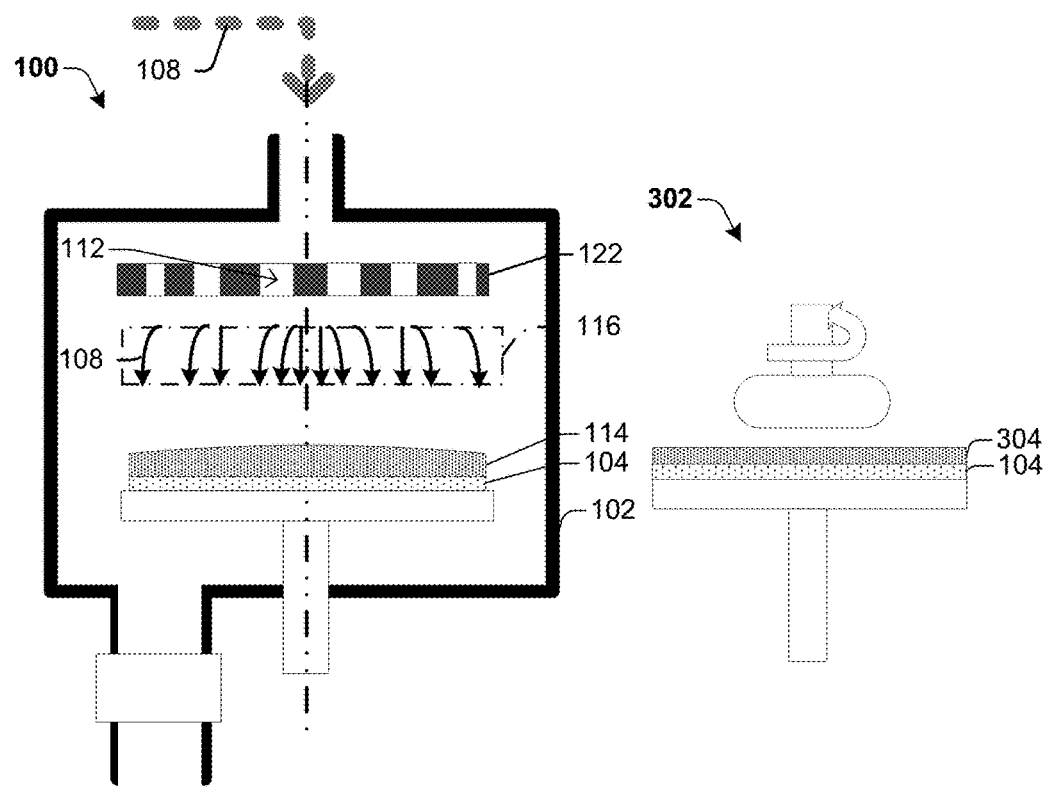
FIG. 3C shows a method of chemical vapor deposition (CVD) having a deposition thickness profile matching a pre-determined CMP remove profile in accordance with some alternative embodiments.

FIG. 3C shows a method of chemical vapor deposition (CVD) having a deposition thickness profile matching a pre-determined CMP remove profile in accordance with some alternative embodiments. Comparing to the example shown in FIG. 3B, in some alternative embodiments, the CMP process may perform a polishing process slower at the edge region than the center region and result in a convex shape remove profile instead of the concave shape remove profile shown in diagram 306 of FIG. 3B. The deposition process is designed to form the precursor material 114 with a convex shape onto the semiconductor substrate 104 to match the CMP remove profile. The shower head 122 is arranged under the gas import 106 of the vacuum chamber 102 and has the holes 112 with a smaller diameter at the edge region than the center region. The process gas 108 passes through the holes 112 and accumulates as the redirected gas 116 under the shower head 122. The redirected gas 116 is laterally unevenly distributed and has a smaller density at the edge region than the center region. As a result, the deposited precursor material 114 is non-uniform and is center thick in this example. Then, the CMP process is performed to the precursor material 114 to form a dielectric or metal layer 304 with a planar surface. The CMP remove profile may also be analyzed and altered according to a surface profile study of the dielectric or metal layer 304 to further improve the surface profile of the dielectric or metal layer 304.

Figure 4:
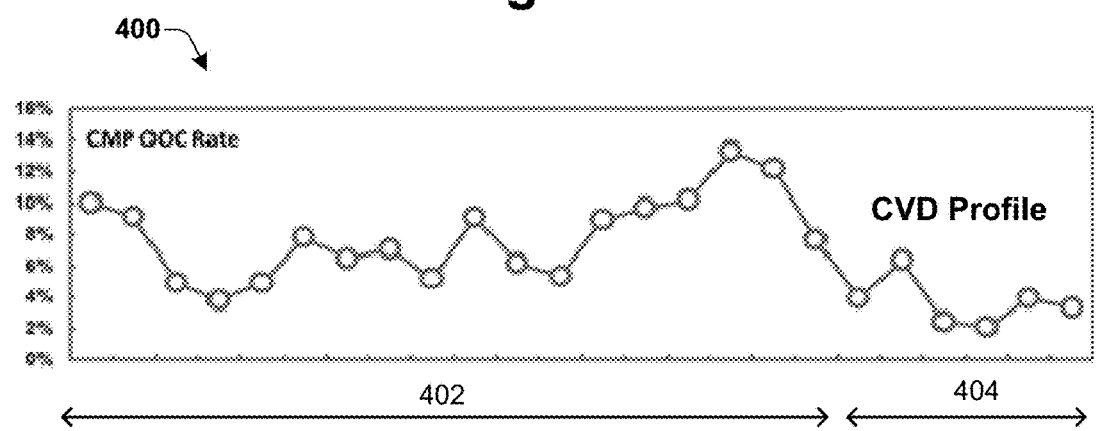
FIG. 4 shows a wafer thickness control comparison of an embodiment of the disclosed method and a previous approach after a CMP process.

FIG. 4 shows a wafer thickness control comparison of an embodiment of the disclosed method and a previous approach after a CMP process. Diagram 400 shows an out of control (OOC) rate of a surface profile of a semiconductor substrate as a result of a CVD process and a CMP process. In a first region 402, a first group of test is performed where the CVD process and the CMP process are performed to respectively target to form a planar surface profile with uniform thickness. The thickness quality is controlled by average thickness and variance. The measurement result shows the OOC rate of the first group of test is between about 4% and 12%. In a second region 404, a second group of test is performed in a way disclosed in this application, where a remove profile of the CMP process is studied, and the CVD process is performed to a precursor material having a surface profile matching the remove profile of the CMP process. The measurement result shows the OOC rate of the second group of test is mostly under 7% and is obviously better than the first group.

Figure 5:
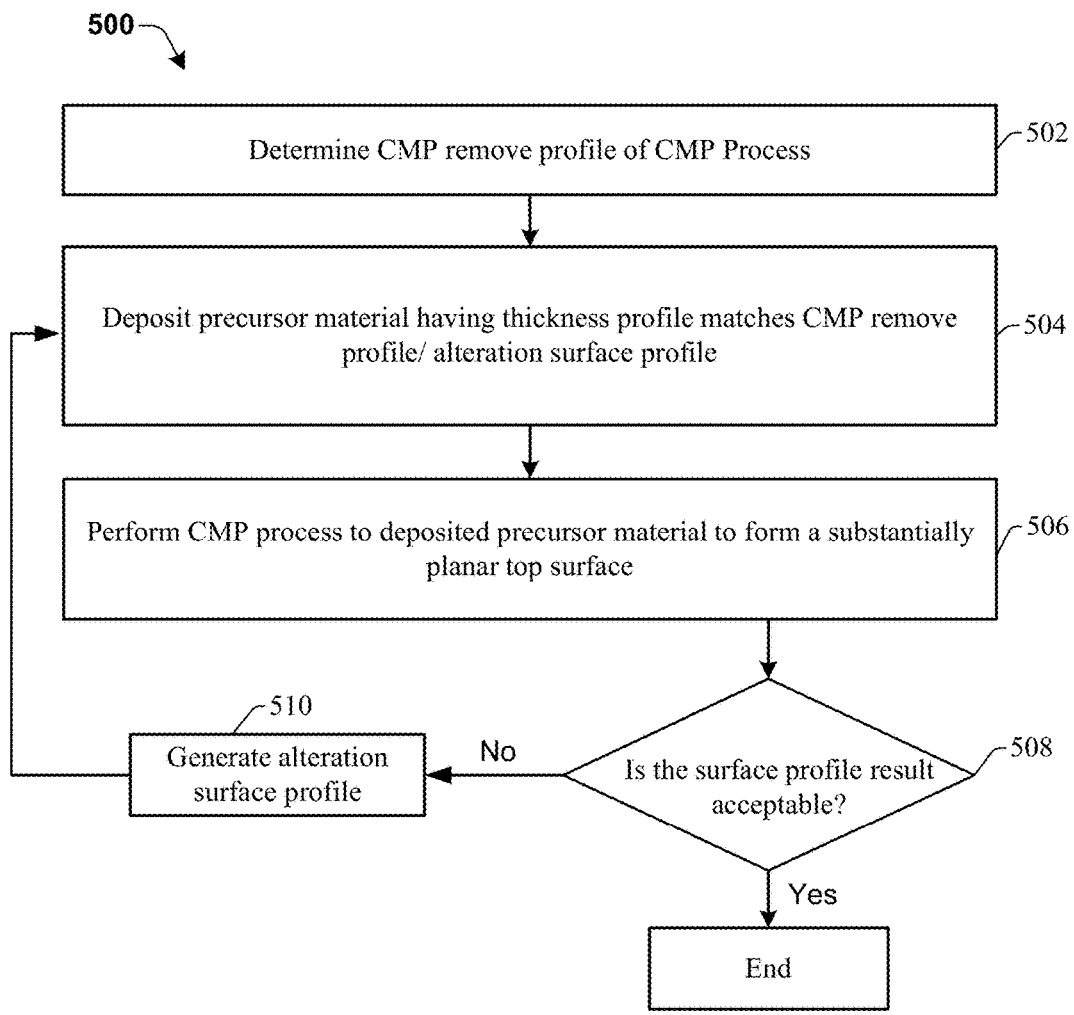
FIG. 5 shows a flow diagram of a method of chemical vapor deposition (CVD) in accordance with some embodiments.

FIG. 5 shows a flow diagram of a method of chemical vapor deposition according to some embodiments.

At act 502, a CMP remove profile of a CMP process is determined. The CMP remove profile may be determined by a modeling process or a prototype test.

At act 504, a deposition process is performed to deposit a precursor material onto a semiconductor substrate having a thickness profile matches the CMP remove profile. The deposition process is performed by applying a process gas from one side of a chamber to the opposite side of the chamber. The chamber can be horizontal or vertical tube reactors, showerhead reactors, atmospheric pressure CVD reactors, metal organic CVD reactor, photo induced CVD reactors or plasma enhanced CVD reactors among other types of chambers. The thickness profile can be controlled by arranging a shower head under a gas import of the chamber to redistribute the process gas. The shower head has holes with different diameters at the edge region than the center region. The process gas passes through the holes and accumulates under the shower head laterally unevenly distributed and reaches the semiconductor substrate arranged substantially perpendicular to an axis of a flow path of the process gas. As a result, the deposited precursor material is non-uniform and is edge thick or center thick for example.

At act 506, the CMP process is performed to the deposited precursor material to form a dielectric or metal layer having a substantially planar top surface.

At 508, in some embodiments, a surface profile analysis is performed and an alteration surface profile is generated. The deposition process may be altered according to the alteration surface profile to improve planarity of the top surface of the dielectric or metal layer for the next round of fabrication.

At 508, in some embodiments, a surface profile analysis is performed to generate a surface profile result. If the surface profile result is acceptable, the workpiece is ready for subsequent processes.

At 510, if the surface profile result is unacceptable, an alteration surface profile is generated. The deposition process may be altered according to the alteration surface profile to improve planarity of the top surface of the dielectric or metal layer for the next round of fabrication.

In general, the present disclosure is related to an optimized CVD apparatus designed to deposit a precursor material having a surface profile matches a remove profile of subsequent processes in order to form a more reliable planar layer. More particularly, the present disclosure is about using a shower head of a CVD chamber to redistribute process gas to form a precursor material with an uneven thickness that matches a remove profile of a subsequent CMP process. As a result, planarity of the formed layer after the CMP process is improved.

Thus, it will be appreciated that some embodiments relate to a CVD apparatus. The CVD apparatus comprises a vacuum chamber. The CVD apparatus further comprises a gas import having a gas import axis through which a process gas is imported into the vacuum chamber and being arranged near an upper region of the vacuum chamber and at least one exhaust port arranged near a bottom region of the vacuum chamber. The CVD apparatus further comprises a wafer chuck arranged between the gas import and the exhaust port to hold a semiconductor substrate. The CVD apparatus further comprises a shower head arranged under the gas import having a plurality of holes formed there through with at least two different diameters or densities.

Other embodiments relate to a method of chemical vapor deposition. In this method, a CMP remove profile of a chemical-mechanical polishing (CMP) process is determined. A precursor material is deposited onto a semiconductor substrate according to the determined CMP remove profile, such that the deposited precursor material has a thickness profile that matches the CMP remove profile. The CMP process is then performed to the precursor material to form a dielectric or metal layer with a planar surface.

Still, other embodiments relate to a method of forming a planar dielectric layer over a semiconductor substrate. In this method, a process gas is applied into a vacuum chamber from a gas import arranged near an upper region of the vacuum chamber. The process gas is guided downstream the vacuum chamber through a shower head arranged under the gas import, where the process gas is redirected to be laterally unevenly distributed under the shower head. The process gas is deposited onto the semiconductor substrate arranged between the shower head and an exhaust port arranged near a bottom region of the vacuum chamber to form a dielectric material, such that the deposited dielectric material has an uneven thickness profile from a center region to an edge region of the semiconductor substrate as a result of uneven distribution of the process gas.

The foregoing outlines feature of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure and that they may make various changes, substitutions, and alterations herein without departing from the spirit and scope of the present disclosure.

What is claimed is:

1. A method of chemical vapor deposition (CVD), comprising:
   determining a CMP remove profile of a chemical-mechanical polishing (CMP) process;
   guiding a process gas of a precursor material through a block plate, the block plate having a plurality of apertures with smaller density or smaller size dimensions in a central region than an edge region, wherein an uneven arrangement of the plurality of apertures corrects an uneven accumulation of the process gas;
   guiding the process gas out from the block plate through a shower head, the shower head being spatially separated from the block plate and having multiple control zones where holes of the shower head are unevenly distributed to direct the process gas to have an uneven distribution from the multiple control zones;
   depositing the precursor material onto a semiconductor substrate according to the determined CMP remove profile, such that the deposited precursor material has a thickness profile that matches the CMP remove profile; and
   performing the CMP process to the precursor material to form a dielectric or metal layer with a planar surface.

2. The method of claim 1, wherein the precursor material is deposited onto the semiconductor substrate such that a thickness of the precursor material increases from a center region to a peripheral region of the semiconductor substrate.

3. The method of claim 1, wherein the precursor material is deposited in a plasma enhanced chemical vapor deposition (PECVD) apparatus.

4. The method of claim 1, wherein the precursor material is deposited onto the semiconductor substrate such that a thickness of the precursor material decreases from a center region to a peripheral region of the semiconductor substrate.

5. The method of claim 1, further comprising:
   after performing the CMP process, performing a surface profile analysis to the semiconductor substrate and generating an alteration surface profile; and
   depositing a precursor material onto a second semiconductor substrate such that the deposited precursor material has a thickness profile that matches the alteration surface profile.

6. The method of claim 1, wherein the precursor material is an oxide material and is formed by a plasma enhanced tetraethylorthosilicate (PETEOS) process.

7. The method of claim 1, wherein the multiple control zones have the same number of hole rings, and an outer control zone of the multiple control zones has holes with an average diameter about 4% to about 8% greater than that of an inner control zone abutting the outer control zone.

8. The method of claim 1, wherein the shower head is selected, or an hole arrangement of the shower head is adjusted according to the CMP remove profile.

9. The method of claim 2, wherein the thickness of the precursor material in the peripheral region of the semiconductor substrate is at least 3% greater than that of the center region.

10. The method of claim 2, wherein the thickness of the precursor material increases linearly from the center region to the peripheral region of the semiconductor substrate.

11. A method of forming a planar dielectric layer over a semiconductor substrate, comprising:
providing a CMP remove profile of a CMP process;
applying a process gas into a vacuum chamber from a gas import arranged near an upper region of the vacuum chamber;
guiding the process gas downstream the vacuum chamber through a shower head arranged under the gas import, where the process gas is redirected to be laterally unevenly distributed under the shower head;
depositing the process gas onto the semiconductor substrate arranged between the shower head and an exhaust port arranged near a bottom region of the vacuum chamber to form a dielectric material, such that the dielectric material has an uneven thickness profile from a center region to an edge region of the semiconductor substrate as a result of uneven distribution of the process gas; and
performing a chemical-mechanical polishing (CMP) process to the dielectric material such that the dielectric material is polished to form a dielectric layer with a substantially planar top surface;
wherein the uneven thickness profile of the dielectric material matches the CMP remove profile of the CMP process.

12. The method of claim 11, further comprising:
performing a surface profile analysis to the dielectric layer and generating an alteration surface profile;
replacing or adjusting the shower head within the vacuum chamber according to the alteration surface profile; and
placing a second semiconductor substrate to the vacuum chamber to deposit the dielectric material onto the second semiconductor substrate such that the dielectric material has a thickness profile matches the alteration surface profile.

13. The method of claim 11, wherein the dielectric material is deposited on the semiconductor substrate such that a thickness of the dielectric material increases from a center region to a peripheral region of the semiconductor substrate.

14. The method of claim 11,
wherein the shower head of the vacuum chamber is prepared to have at least three control zones defined from a center region to an edge region, wherein each of the control zones has a plurality of holes with an average diameter, wherein the average diameter monotonously increases or decreases from the center region to the edge region.

15. The method of claim 11, wherein the dielectric material is formed by a plasma enhanced chemical vapor deposition (PECVD) process.

16. The method of claim 11, wherein the uneven thickness profile of the dielectric material is controlled by adjusting a hole arrangement of the shower head of the vacuum chamber.

17. A method, comprising:
applying a process gas into a vacuum chamber from a gas import arranged near an upper region of the vacuum chamber;
guiding the process gas downstream the vacuum chamber through a shower head arranged under the gas import, where the process gas is redirected to be laterally unevenly distributed under the shower head, wherein a density of the process gas increases from a center region to a peripheral region of the vacuum chamber;
depositing the process gas onto a first semiconductor substrate arranged between the shower head and an exhaust port arranged near a bottom region of the vacuum chamber to form a precursor material with an uneven thickness profile as a result of uneven distribution of the process gas; and
performing a chemical-mechanical polishing (CMP) process to the uneven thickness profile to form a substantially planar top surface, wherein the uneven thickness profile matches a CMP remove profile of the CMP process;
wherein the shower head has multiple control zones each having a plurality of holes disposed through the shower head, and an outer control zone of the multiple control zones has holes with an average diameter about 4% to about 8% greater than that of an inner control zone abutting the outer control zone.

18. The method of claim 17, further comprising:
performing a surface profile analysis after the CMP process to generate an alteration surface profile;
replacing or adjusting the shower head within the vacuum chamber according to the alteration surface profile; and
depositing the precursor material on a second semiconductor substrate in the vacuum chamber such that the deposited precursor material has a thickness profile that matches the alteration surface profile.

19. The method of claim 17,
wherein the shower head of the vacuum chamber is prepared to have at least three control zones defined from a center region to an edge region, wherein each of the control zones has a plurality of holes with an average diameter, wherein the average diameter monotonously increases or decreases from the center region to the edge region.

20. The method of claim 17, wherein the thickness of the precursor material in the peripheral region of the first semiconductor substrate is at least 3% greater than that of the center region.

* * * * *